(12) United States Patent
Togashi et al.

(10) Patent No.: US 12,014,948 B2
(45) Date of Patent: Jun. 18, 2024

(54) SEMICONDUCTOR HEAT TREATMENT MEMBER AND MANUFACTURING METHOD THEREOF

(71) Applicant: CoorsTek KK, Tokyo (JP)

(72) Inventors: Sayaka Togashi, Yamagata (JP);
Nobuyuki Munakata, Yamagata (JP);
Kenji Suzuki, Yamagata (JP)

(73) Assignee: COORSTEK GK, Tokyo (JP)

( * ) Notice: Subject to any disclaimer, the term of this patent is extended or adjusted under 35 U.S.C. 154(b) by 380 days.

(21) Appl. No.: 17/552,170

(22) Filed: Dec. 15, 2021

(65) Prior Publication Data

US 2022/0208597 A1    Jun. 30, 2022

(30) Foreign Application Priority Data

Dec. 25, 2020  (JP) .................. 2020-217457
Jul. 30, 2021  (JP) .................. 2021-125049

(51) Int. Cl.
| | | |
|---|---|---|
| H01L 21/68 | (2006.01) | |
| C01B 32/956 | (2017.01) | |
| C01B 33/12 | (2006.01) | |
| H01L 21/687 | (2006.01) | |
| H01L 21/67 | (2006.01) | |

(52) U.S. Cl.
CPC ...... H01L 21/68757 (2013.01); C01B 32/956 (2017.08); C01B 33/12 (2013.01); *C01P 2006/90* (2013.01); *H01L 21/67115* (2013.01); *H01L 21/68735* (2013.01)

(58) Field of Classification Search
CPC ......... H01L 21/68757; H01L 21/67115; H01L 21/68735; H01L 21/68785; C01B 32/956; C01B 33/12; C01P 2006/90; C23C 16/4581; C23C 16/45561; C30B 25/12; H01J 37/3244; H01J 37/32449
USPC ........ 269/286; 118/728, 729, 730, 731, 732; 156/345.51, 345.52, 345.53, 345.54, 156/345.55; 279/1
See application file for complete search history.

(56) References Cited

U.S. PATENT DOCUMENTS

2003/0071260 A1* 4/2003 Ootsuka ............ H01J 37/32009
257/44

FOREIGN PATENT DOCUMENTS

| JP | 2000-315720 A | 11/2000 |
|---|---|---|
| JP | 2002-231713 A | 8/2002 |
| JP | 2004-152900 A | 5/2004 |
| JP | 2005-203648 A | 7/2005 |

OTHER PUBLICATIONS

Korean Patent Office, Office Action, Application No. KR 10-2021-0170992, dated Jul. 31, 2023, in 13 pages.

* cited by examiner

*Primary Examiner* — Rudy Zervigon
(74) *Attorney, Agent, or Firm* — PROCOPIO, CORY, HARGREAVES & SAVITCH LLP

(57) ABSTRACT

The present invention relates to a semiconductor heat treatment member for holding a semiconductor wafer, including a base member a surface of which is covered with an oxide film, the base member including a silicon carbide, in which a surface of a wafer holding portion to be in contact with a semiconductor wafer has an arithmetic average roughness Ra of smaller than or equal to 0.3 μm and an element average length RSm of shorter than or equal to 40 μm.

5 Claims, 3 Drawing Sheets

SEMICONDUCTOR HEAT TREATMENT MEMBER AND MANUFACTURING METHOD THEREOF

TECHNICAL FIELD

The present invention relates to a semiconductor heat treatment member, for example, a semiconductor heat treatment member that is used preferably in an RTP machine (rapid thermal processing machine) and can be applied to a ring for holding a semiconductor wafer, as well as to a manufacturing method thereof.

BACKGROUND ART

In semiconductor manufacturing processes, RTP machines are used in techniques for preforming heat treatment on a semiconductor wafer using a thermal processing machine. RTP, which stands for "rapid thermal process," means a rapid thermal process and RTP machines make it possible to manufacture ultrathin silicon oxide films of 10 nm or smaller in thickness.

RTP machines employ a heat treatment technique using lamp heating, and this technique is characterized in that a wafer is heated rapidly (at a rate of about 1,000° C. in several tens of seconds) and infrared lamps arranged at regular intervals are controlled individually by feedback of wafer surface temperatures. This makes it possible to control differences between wafer surface temperatures with high accuracy.

Common RTP machines employ tungsten-halogen lamps etc. as light source lamps. A semiconductor wafer mounted on and held by a wafer holding ring is caused to directly absorb the energy produced by the light source lamps. Since a clean gas environment of $N_2$ gas or the like is necessary for semiconductor wafer treatment, a processing chamber main body has a structure that it is sealed using a quartz window made of quartz which is high in halogen light transmission efficiency and is thermally stable. A wafer is mounted on a wafer holding ring that is located around the center of the processing chamber where the light illumination is well-balanced. Capable of heating a wafer using no heating medium, the method using such an RTP machine can minimize the heat capacity that determines a heat response. As a result, enabling instantaneous heating, this method is low in the probability of destroying wafer structures and is considered particularly effective for wafer annealing (refer to Patent document 1).

In RTP machines, in general, a wafer holding ring to be mounted with a wafer is made of silicon carbide ceramic. This is because silicon carbide materials are high in heat resistance and thermal conductivity and hence enable uniform heating of a semiconductor wafer and are not prone to damage the semiconductor wafer (refer to Patent document 1). Wafer holding rings in which a silicon carbide film is formed by CVD method on the surface of a base member made of carbon or the like are also used frequently (refer to Patent document 2).

In particular, in cases where a large amount of heat is applied in a short time as in the case of RTP machines, attempts of decreasing the thickness of a wafer holding ring are being made to minimize the heat capacity which determines the heat response of the machine.

However, although thermal properties of a conventional wafer holding ring are improved as it becomes thinner, when made thinner, conventional wafer holding rings are made so low in mechanical strength as to be damaged structurally and thermally because the silicon carbide material of wafer holding rings is low in toughness.

In particular, to make the thickness in the heat transfer direction smaller than or equal to 1.2 mm, it is necessary to perform mechanical working using a diamond whetstone, loose abrasives, or the like. However, in this case, minute polishing scratches (tool marks) remain in the working target surface of a wafer holding ring to make its strength much lower than the original strength of silicon carbide. As such, conventional wafer holding rings are prone to be damaged with minute polishing scratches in the working target surface acting as starting point.

Silicon carbide materials that make up wafer holding rings is 99.5% or higher in purity and are dense materials that are 97% or higher in theoretical density. Silicon carbide materials that are low in purity and density are low in thermal conductivity, as a result of which, when a wafer holding ring made of such a silicon carbide material is used in an RTP machine the entire body of product has large differences in a heat distribution and hence suffer resulting strong thermal stress; the wafer holding ring may be broken during use.

Where wafer holding rings are 1 mm or smaller in thickness, if they are 1.6 μm or higher in surface roughness Ra, it is highly probable that they are damaged due to physical damage caused by handling, transport, etc. or repeated thermal contraction.

In view of the above problems, Patent document 3 discloses a wafer holding ring in which the base member is made of silicon carbide ceramic and is formed with a silicon oxide film of 0.05 to 5 μm in thickness on the surface. This document states as follows. The wafer holding ring has a surface roughness Ra of 1.6 μm or lower, and lowering of mechanical strength due to minute polishing scratches etc. in the working target surface and damaging due to thermal stress can be prevented. As such, this wafer holding ring is suitable for use in rapid thermal processing machines such as RTP machines.

CITATION LIST

Patent Literature

[Patent document 1] JP-A-2000-315720
[Patent document 2] JP-A-2002-231713
[Patent document 3] JP-A-2004-152900

Technical Problem

However, in the wafer holding ring disclosed in Patent document 3, even the surface roughness Ra being 1.6 μm or lower is insufficient to form an oxide film being superior in thickness uniformity on a wafer surface by controlling the property of heat transfer to the semiconductor wafer.

After a diligent study, the present inventors have found that to form a good oxide film on the surface of a semiconductor wafer by controlling the property of heat transfer to the semiconductor wafer, it is important to control both of the arithmetic average roughness Ra which is an index in the height direction and the average length RSm which is an index in in-plane directions.

The inventors have conceived the invention on condition that both of the arithmetic average roughness Ra which is an index in the height direction and the average length RSm which is an index in in-plane directions be controlled.

SUMMARY OF INVENTION

The present invention has been made in the above circumstances in the art, and an object of the present invention is therefore to provide a semiconductor heat treatment member that can be applied to a ring for holding a semiconductor wafer and, in forming an oxide film on the surface of a semiconductor wafer by heat treatment, can make the heat transfer to the semiconductor wafer uniform and thereby make the thickness variation of a resulting oxide film formed on the surface of the wafer small, as well as a manufacturing method thereof.

A semiconductor heat treatment member of the present invention that has been conceived to solve the above problem is a semiconductor heat treatment member for holding a semiconductor wafer, including a base member a surface of which is covered with an oxide film, the base member including a silicon carbide, in which a surface of a wafer holding portion to be in contact with a semiconductor wafer has an arithmetic average roughness Ra of smaller than or equal to 0.3 μm and an element average length RSm of shorter than or equal to 40 μm.

It is preferable that the difference ΔRa between a maximum value and a minimum value of values of the arithmetic average roughness Ra of the surface of the wafer holding portion be smaller than or equal to 0.15 μm.

It is preferable that a thickness of the wafer holding portion be smaller than or equal to 1 mm.

It is preferable that a thickness of the oxide film formed on the surface of the wafer holding portion be larger than or equal to 0.3 μm and smaller than or equal to 3 μm.

In the thus-configured semiconductor heat treatment member, the surface to be brought into contact with a semiconductor wafer is formed so that its arithmetic average roughness Ra is smaller than or equal to 0.3 μm and its average length RSm of roughness elements is shorter than or equal to 40 μm. As a result, the heat transfer to a semiconductor wafer held thereon is made uniform. This makes it possible to reduce the thickness variation of an oxide film formed on the surface of the semiconductor wafer, when the oxide film is formed on the semiconductor wafer by performing heat treatment.

A semiconductor heat treatment member manufacturing method of the present invention that has been conceived to solve the above problem is a manufacturing method of the above semiconductor heat treatment member, including:

obtaining a ring-shaped base member comprising the silicon carbide;

processing a surface of the base member using a diamond whetstone so that the arithmetic average roughness Ra becomes smaller than or equal to 0.3 μm and the element average length RSm becomes shorter than or equal to 40 μm; and forming the oxide film on the surface of the base member at a thickness of larger than or equal to 0.3 μm and smaller than or equal to 3 μm by heating the base member in an oxidizing atmosphere.

This manufacturing method makes it possible to provide a semiconductor heat treatment member having the above-described features.

As described above, the present invention can provide a semiconductor heat treatment member that can be applied to a ring for holding a semiconductor wafer and, in forming an oxide film on the surface of a semiconductor wafer by heat treatment, can make the heat transfer to the semiconductor wafer uniform and thereby make the thickness variation of a resulting oxide film formed on the surface of the semiconductor wafer small, as well as a manufacturing method thereof.

DETAILED DESCRIPTION OF EMBODIMENT

Figure 1:
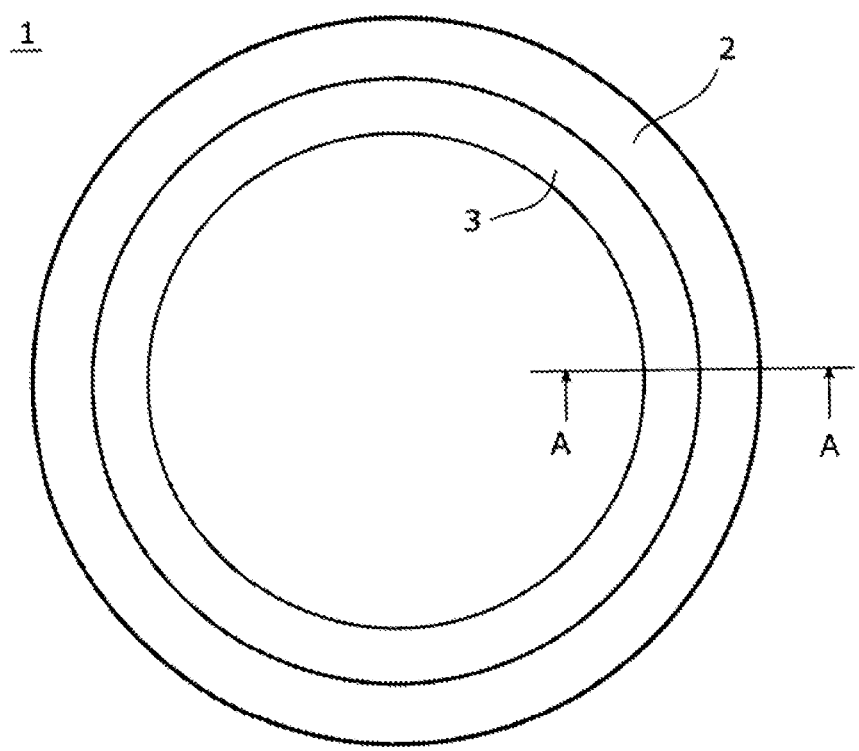
FIG. 1 is a plan view of a semiconductor heat treatment member of an embodiment of the present invention.
Figure 2:
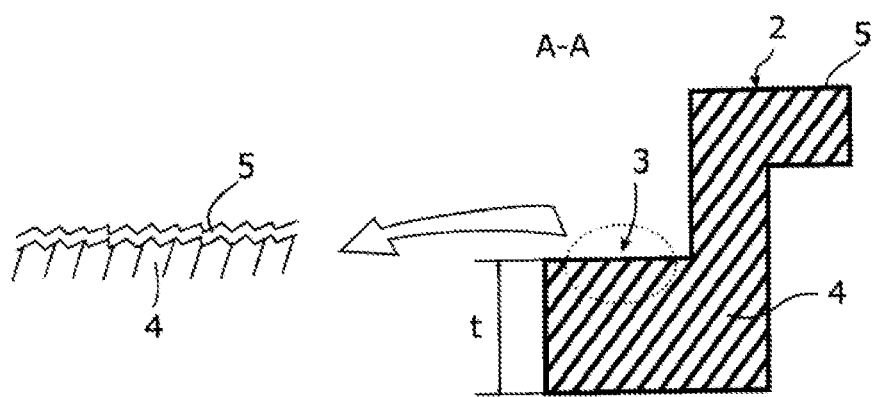
FIG. 2 is a sectional view taken along an arrowed line A-A in FIG. 1.

A semiconductor heat treatment member of an embodiment of the present invention will be hereinafter described with reference to FIGS. 1 and 2. FIG. 1 is a plan view of a ring that is a semiconductor heat treatment member of the present invention and FIG. 2 is a sectional view taken along an arrowed line A-A in FIG. 1. These figures are schematic or conceptual ones and do not show precisely a thickness-width relationship of each portion, size ratios between individual portions, etc.

The embodiment is directed to a case that the semiconductor heat treatment member of the present invention is applied to a ring for holding a semiconductor wafer to perform, for example, forming process of an oxide film on the surface of a semiconductor wafer in an RTP machine.

As shown in FIG. 1, a ring 1 (semiconductor heat treatment member) is composed of a ring-shaped frame portion 2 and a wafer holding portion 3 which is formed inside and below the frame portion 2 and serves to be mounted with a semiconductor wafer.

The frame portion 2 and the wafer holding portion 3 are formed in such a manner that an oxide film 5 is formed on the surface of a base member 4 which is made of silicon carbide. The thickness of the oxide film 5 is approximately in a range of 0.3 to 3 μm, preferably 0.8 to 1.2 μm. Because of the formation of the oxide film 5, compressive stress acts toward the base member 4, resistance is provided, whereby the ring 1 can be prevented from being broken due to a mechanical load at the time of being mounted with wafer or a load of a heat cycle even if the base member 4 is thin.

If the oxide film 5 is thinner than 0.3 μm, when the base member 4 is thin, the resistance to a mechanical load and a heat cycle becomes so low that the ring 1 may be broken. On the other hand, if the oxide film 5 is thicker than 3 μm, the thermal conductivity of the ring 1 becomes so low that a heat treatment result may become spotty. Another problem is that the oxide film 5 may be peeled off to form particles that is a cause of wafer contamination.

It is preferable that the thickness t of the wafer holding portion 3 (the sum of the thicknesses of the base member 4 and the oxide film 5) be smaller than or equal to 1 mm, even preferably smaller than or equal to 0.5 mm. Making the wafer holding portion 3 thin decreases the heat capacity of the base member 4 and thereby increases its thermal responsiveness. The thickness t is preferably larger than or equal to 0.20 mm from the view point of ensuring strength.

The wafer holding portion 3 being thicker than 1 mm is not preferable because an increased heat capacity of the base member 4 lowers its thermal responsiveness.

There are no particular limitations on the inner diameter of the ring-shaped frame portion 2 of the ring 1 as long as it can be fitted with a semiconductor wafer. The inner diameter of the ring-shaped frame portion 2 may have a desired value depending on the outer diameter of a semiconductor wafer to be subjected to heat treatment.

It is preferable that the wafer holding portion 3 which is located inside and below the frame portion 2 make the surface of a semiconductor wafer be approximately parallel with the top surface of the ring 1 when the semiconductor wafer is mounted on the top surface of the wafer holding portion 3. This allows the entire semiconductor water to be heated uniformly when heat treatment is performed by an RTP machine or the like.

Although there are no particular limitations on the inner diameter of the wafer holding portion 3 as long as a semiconductor wafer can be mounted thereon, it is preferable that the inner diameter of the wafer holding portion 3 be a little smaller than the outer diameter of a semiconductor wafer to be mounted. This makes the contact portions of the wafer holding portion 3 and the semiconductor wafer small as to prevent diffusion of heat applied to the semiconductor wafer through the wafer holding portion 3 and to lower the degree of unevenness in heat distribution and thereby enable uniform heating of the semiconductor wafer.

The surface of the wafer holding portion 3 is formed so that its arithmetic average roughness Ra which is an index in the height direction is smaller than or equal to 0.3 μm and its average length RSm of roughness curve elements is shorter than or equal to 40 μm.

If the arithmetic average roughness Ra is larger than 0.3 μm, a gap is formed between a semiconductor wafer and the surface (mounting surface) of the wafer holding portion 3 and the heat transfer property is thereby lowered. As a result, it becomes difficult to uniformly transfer heat to the semiconductor wafer.

If the average length RSm of roughness curve elements is greater than 40 μm, the contact area between a semiconductor wafer and the wafer holding portion 3 is reduced, as a result of which, there is a concern that the degree of heat transfer by conduction may deteriorate. Therefore, the average length RSm being greater than 40 μm is not preferable.

It is preferable that the average length RSm of roughness curve elements is greater than or equal to 15 μm to prevent the wafer from sticking to the wafer holding portion 3 during the heat treatment.

It is better for the arithmetic average roughness Ra of the wafer mounting surface to have a smaller variation; it is preferable that the difference ΔRa between a maximum value and a minimum value of Ra be smaller than or equal to 0.15 μm. And it is even preferable that the difference ΔRa be smaller than or equal to 0.1 μm, in which case a better heat transfer property is obtained and hence a wafer with an oxide film that is higher in thickness uniformity can be obtained in a process of forming an oxide film on a semiconductor wafer. By processing a semiconductor wafer using the ring 1 having such a wafer holding portion 3 (wafer mounting surface), the thickness variation of an oxide film on the wafer surface can be made smaller than or equal to 0.1 nm.

Next, a manufacturing method of a ring 1 of the present invention will be described. First, to manufacture a base member 4 made of silicon carbide, a silicon carbide material is shaped into a formed body having a prescribed ring shape and the formed body is sintered to obtain a ring-shaped base member 4 having high thermal conductivity. Alternatively, silicon carbide is grown on the surface of a carbon base member by CVD method and the carbon base member is then removed to obtain a ring-shaped silicon carbide base member 4 having high thermal conductivity.

Subsequently, the surface of the ring-shaped base member 4 is subjected to working such as grinding or polishing using a diamond whetstone so that its arithmetic average roughness Ra becomes smaller than or equal to 0.3 μm and its element average length RSm becomes shorter than or equal to 40 μm. Furthermore, oxidation treatment is performed on the base member 4 by applying heat at 1,000° C. to 1,300° C. in an oxidizing atmosphere, whereby an oxide film 5 is formed on the entire surface of the base member 4 at a thickness of about 0.3 to 3 μm, preferably 0.8 to 1.2 μm. A ring 1 is thus obtained.

Figure 3:
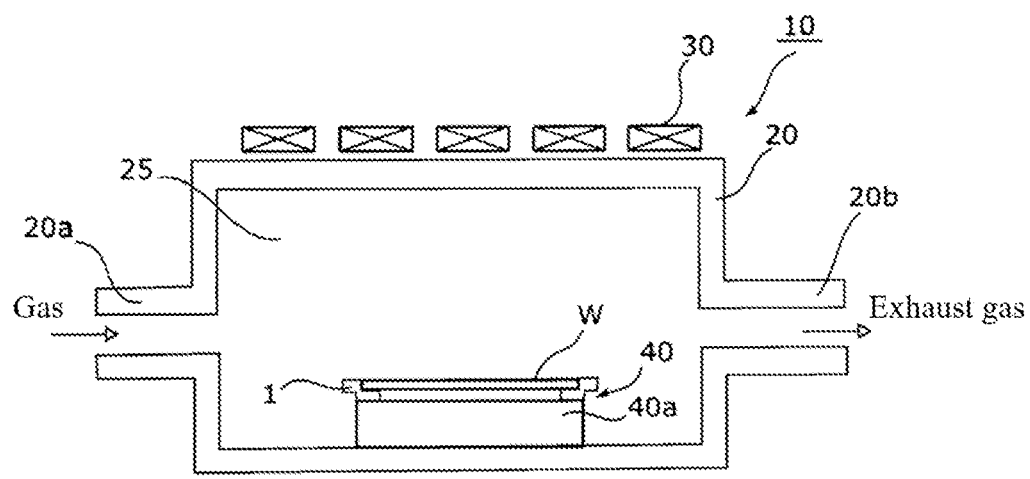
FIG. 3 is a schematic sectional view of an RTP machine that uses the semiconductor heat treatment member shown in FIG. 1.

FIG. 3 shows one form of an RTP machine 10 including the ring 1 of the present invention. As shown in FIG. 3, the RTP machine 10 includes a chamber (reaction pipe) 20 having an atmosphere gas inlet 20a and an atmosphere gas outlet 20b, plural lamps 30 installed over the chamber 20 so as to be spaced from each other, and a substrate support member 40 which supports a semiconductor wafer W in a reaction space 25 inside the chamber 20. The RTP machine also includes a rotating means (not shown) for rotating the semiconductor wafer W on its center axis at a prescribed speed.

The substrate support member 40 includes the ring 1 of the present invention which supports an outer circumferential portion of the semiconductor wafer W and a stage 40a which supports the ring 1. The chamber 20 is made of quartz, for example. The lamps 30 are halogen lamps, for example. The stage 40a is made of quartz, for example. The RTP machine 10 can process the entire semiconductor wafer W uniformly by heating with an ascending or descending temperature gradient of 10 to 300° C./sec.

As for a temperature control in the reaction space 25 of the RTP machine 10, an average of temperatures at plural points (e.g., 9 points), arranged in the substrate surface in the substrate radial direction, of the ring 1 is measured by plural radiation thermometers that are buried in the stage 40a of the substrate support member 40 and the plural halogen lamps 30 are controlled (e.g., on/off controls of the respective lamps 30 and controls of the intensities of emitted light beams) on the basis of the measured temperature.

Next, a heat treatment method for a semiconductor wafer W performed by the RTP machine 10 having the ring 1 that is the semiconductor heat treatment member of the embodiment will be described below with reference to FIG. 3.

First, a semiconductor wafer W is mounted on and fixed to the ring 1. As a result, the bottom surface of an outer circumferential portion of the semiconductor wafer W is brought into contact with the wafer holding portion 3. The ring 1 is then fixed to a top portion of the stage 40a installed in the reaction space 25 having an oxidizing atmosphere so that the top surface of the semiconductor wafer W becomes approximately parallel with the top portion of the stage 40a.

While process gas is introduced from the atmosphere gas inlet 20a, gas in the reaction space 25 is exhausted from the atmosphere gas outlet 20b, whereby a prescribed gas flow is formed over the semiconductor wafer W.

Subsequently, the heat treatment for the semiconductor wafer W is performed by heating the semiconductor wafer W rapidly (e.g., at a rate of about 1,000° C. in several tens of seconds) while controlling the surface temperature of the semiconductor wafer W by controlling individually the halogen lamps 30 arranged at regular intervals by feedback of a surface temperature of the semiconductor wafer W. As a result, a desired oxide film is formed on the surface of the semiconductor wafer W.

As described above, the ring 1 (semiconductor heat treatment member) of the embodiment is made up of the frame 2 and the wafer holding portion 3 which are formed in such a manner that the oxide film 5 is formed on the surface of the base member 4 made of silicon carbide. The surface of the wafer holding portion 3 has the arithmetic average roughness Ra of smaller than or equal to 0.3 µm and the average length RSm of roughness elements of shorter than or equal to 40 µm. As a result, in forming an oxide film on a semiconductor wafer W by heat treatment, the heat transfer to the semiconductor wafer W held by the wafer holding portion 3 is made uniform, whereby the thickness variation of an oxide film formed on the surface of the semiconductor wafer W can be made small.

Although the embodiment is directed to the ring as an example of the semiconductor heat treatment member of the present invention, the present invention is not limited to this form and can be applied broadly to semiconductor heat treatment members in which the surface of a base member made of silicon carbide is covered with an oxide film.

Examples

The semiconductor heat treatment member and its manufacturing method of the present invention will be described in more detail using Examples.

Experiment 1

In Experiment 1, plural rings (Examples 1-5 and Comparative Examples 1-3) that were different from each other in the surface state of the wafer holding portion (wafer mounting surface) were prepared, semiconductor wafers held by the respective rings were subjected to heat treatment, and thickness uniformity of an oxide film formed on the surface of each semiconductor wafer was checked.

In preparing each ring, the surface of the base member was ground by a diamond whetstone so that the arithmetic average roughness Ra is smaller than or equal to 0.3 µm and the element average length RSm is shorter than or equal to 40 µm. Then the base member was subjected to oxidation treatment by applying heat to it at 1,000° C. to 1,300° C. in an oxidizing atmosphere, whereby an oxide film of 1.0 µm in thickness was formed on the entire surface of the base member and a wafer holding ring was obtained. Table 1 shows values of the arithmetic average roughness Ra, the element average length RSm and the difference ΔRa in the arithmetic average roughness Ra of the surfaces of the wafer holding portions, respectively.

The surface roughness Ra of the wafer holding portion (wafer mounting surface) of the ring was varied by switching the diamond whetstone grit. Surface roughness Ra was measured using a noncontact roughness gauge. Surface roughness values of the surface of each wafer holding portion were measured at four points arranged at intervals of 90° and an average of them were taken. The difference ΔRa in the arithmetic average roughness Ra which is an index in the height direction was obtained by subtracting a minimum Ra value from a maximum Ra value among the four points.

As for the conditions of heat treatment performed on each semiconductor wafer, heat treatment was performed for 60 to 300 sec in a dry oxidizing atmosphere of 1,000° C. to 1,150° C.

Table 1 shows conditions and results of Examples and Comparative Examples. Table 1 shows, as an evaluation result, thickness uniformity of an oxide film formed on each semiconductor wafer: mark "A" was given if the in-plane variation was smaller than or equal to 0.06 nm, mark "B" was given if the in-plane variation was larger than 0.06 nm and smaller than or equal to 0.08 nm, and mark "C" was given if the in-plane variation was larger than 0.08 nm and smaller than or equal to 0.10 nm. And mark "D" was given if the in-plane variation was larger than 0.10 nm.

TABLE 1

|  | Height direction Ra (µm) | Average length RSm (µm) | Ra difference ΔRa (µm) | Evaluation result Film uniformity |
|---|---|---|---|---|
| Comparative Ex. 1 | 0.350 | 39.2 | 0.15 | D |
| Example 1 | 0.300 | 38.5 | 0.14 | B |
| Comparative Ex. 2 | 0.297 | 41.0 | 0.13 | D |
| Example 2 | 0.230 | 40.0 | 0.11 | B |
| Example 3 | 0.280 | 39.0 | 0.16 | C |
| Example 4 | 0.160 | 32.5 | 0.08 | A |
| Example 5 | 0.110 | 28.9 | 0.09 | A |
| Comparative Ex. 3 | 0.411 | 58.9 | 0.15 | D |

As shown in Table 1, when the arithmetic average roughness Ra of the wafer holding portion was smaller than or equal to 0.3 µm and the in-plane average length RSm of roughness elements was shorter than or equal to 40 µm, the in-plane variation of the oxide film formed on the surface of the semiconductor wafer was as small as 0.10 nm or smaller (Examples 1-5), which is preferable.

On the other hand, when the arithmetic average roughness Ra of the wafer holding portion was larger than 0.3 µm or the in-plane average length RSm of roughness elements was longer than 40 µm, the in-plane variation of the oxide film formed on the surface of the semiconductor wafer was large (Comparative Examples 1-3).

It was therefore confirmed by Experiment 1 that the in-plane variation of the oxide film formed on the surface of a semiconductor wafer can be made smaller than or equal to 0.10 nm by making the arithmetic average roughness Ra of the wafer holding portion smaller than or equal to 0.3 µm in turn and the average length RSm of roughness elements in the surface direction shorter than or equal to 40 µm.

Experiment 2

In Experiment 2, plural rings (Examples 6-11) that were different from each other in the thickness of the oxide film formed on the wafer holding portion (wafer mounting surface) were prepared, semiconductor wafers held by the respective rings were subjected to heat treatment, and thickness uniformity of an oxide film formed on the surface of each semiconductor wafer and the occurrence of particles were checked. The thickness of the oxide film formed on the ring was adjusted by the time of heat treatment performed in an oxidizing atmosphere.

Table 2 shows conditions and results of Examples of Experiment 2. Of the evaluation items shown in Table 2, thickness uniformity of an oxide film formed on each semiconductor wafer was evaluated in the following manner. Mark "A" was given if the in-plane variation was smaller than or equal to 0.06 nm, mark "B" was given if the in-plane variation was larger than 0.06 nm and smaller than or equal to 0.08 nm, and mark "C" was given if the in-plane variation was larger than 0.08 nm and smaller than or equal to 0.10 nm.

As for the occurrence of particles, mark "B" was given if a particle abnormality occurred 10 or more times when a ring was used 100 times repeatedly with semiconductor wafers mounted thereon, and mark "A" was given in other cases.

TABLE 2

|  | Base member of Example 2 was used | | Oxide film Film | Evaluation results | |
|---|---|---|---|---|---|
|  | Ra (μm) | RSm (μm) | thickness (μm) | Film uniformity | Particles |
| Example 6 | 0.230 | 40.0 | 0.25 | C | A |
| Example 7 | 0.230 | 40.0 | 0.31 | B | A |
| Example 8 | 0.230 | 40.0 | 0.81 | A | A |
| Example 9 | 0.230 | 40.0 | 1.20 | A | A |
| Example 10 | 0.230 | 40.0 | 2.98 | B | A |
| Example 11 | 0.230 | 40.0 | 3.52 | C | B |

It was therefore confirmed by Experiment 2 that the thickness of an oxide film formed on the base member is preferably in a range of about 0.3 to 3 μm, more preferably in a range of 0.8 to 1.2 μm.

Although the present invention has been described above in detail referring to a particular embodiment, it is apparent to those skilled in the art that various changes or modifications are possible without departing from the spirit and scope of the present invention.

The present application is based on Japanese Patent Application No. 2020-217457 filed on Dec. 25, 2020 and No. 2021125049 filed on Jul. 30, 2021, the disclosures of which are incorporated herein by reference.

DESCRIPTION OF SYMBOLS

1: Ring
2: Frame portion
3: Wafer holding portion
4: Base member
5: Oxide film
10: RIP machine
W: Semiconductor wafer

What is claimed is:

1. A semiconductor heat treatment member for holding a semiconductor wafer, comprising a base member a surface of which is covered with an oxide film, the base member comprising silicon carbide, wherein a surface of a wafer holding portion to be in contact with a semiconductor wafer has an arithmetic average roughness Ra of smaller than or equal to 0.3 μm and an element average length RSm of shorter than or equal to 40 μm.

2. The semiconductor heat treatment member according to claim 1, wherein a difference ΔRa between a maximum value and a minimum value of values of the arithmetic average roughness Ra of the surface of the wafer holding portion is smaller than or equal to 0.15 μm.

3. The semiconductor heat treatment member according to claim 1, wherein the wafer holding portion has a thickness of smaller than or equal to 1 mm.

4. The semiconductor heat treatment member according to claim 1, wherein the oxide film formed on the surface of the wafer holding portion has a thickness of larger than or equal to 0.3 μm and smaller than or equal to 3 μm.

5. A manufacturing method of the semiconductor heat treatment member according to claim 1, the method comprising:
obtaining a ring-shaped base member comprising the silicon carbide;
processing a surface of the base member using a diamond whetstone so that the arithmetic average roughness Ra becomes smaller than or equal to 0.3 μm and the element average length RSm becomes shorter than or equal to 40 μm; and
forming the oxide film on the surface of the base member at a thickness of larger than or equal to 0.3 μm and smaller than or equal to 3 μm by heating the base member in an oxidizing atmosphere.

* * * * *